United States Patent
Cheng

[11] Patent Number: 5,770,911
[45] Date of Patent: Jun. 23, 1998

[54] RESONANT THERMOELECTRIC GENERATOR

[76] Inventor: Kan Cheng, 40100 San Carlos Pl., Fremont, Calif. 94539

[21] Appl. No.: 594,011

[22] Filed: Jan. 30, 1996

[51] Int. Cl.[6] .................................................. H01L 37/00
[52] U.S. Cl. ........................ 310/306; 136/205; 136/224; 136/293; 307/153; 322/2 R
[58] Field of Search .................................. 136/200, 205, 136/224, 226, 227, 293; 307/151, 153; 310/306, 308; 322/2 R

[56] References Cited

U.S. PATENT DOCUMENTS

| | | | |
|---|---|---|---|
| 3,468,164 | 9/1969 | Sutherland | 73/343 |
| 4,004,210 | 1/1977 | Yater | 322/2 R |
| 4,023,088 | 5/1977 | Fowler | 322/2 R |
| 4,841,286 | 6/1989 | Kummer | 340/653 |
| 5,065,085 | 11/1991 | Aspden et al. | 322/2 R |
| 5,356,484 | 10/1994 | Yater et al. | 136/200 |
| 5,576,512 | 11/1996 | Doke | 136/203 |

OTHER PUBLICATIONS

Direct Energy Conversion by George W. Sutton, 1966, pp.: cover, 4–7, 104, 105, 142, 143, and 238–241.

*Primary Examiner*—Thomas M. Dougherty
*Attorney, Agent, or Firm*—Jack Lo

[57] ABSTRACT

A resonant thermoelectric generator includes a thermoelectric power converter connected in series with a resonant circuit. A current generated by the thermoelectric power converter is cycled back and forth in the resonant circuit. The polarity of the thermoelectric power converter with respect to the resonant circuit is switched back and forth to correspond with the direction of the current. In a second embodiment, the thermoelectric power converter is coupled to the resonant circuit through a transformer, and its polarity is also switched to correspond with the direction of the current. In both embodiments, a negative retarding voltage that builds up in the thermoelectric power converter is eliminated by switching its polarity to always correspond with the direction of the current, so that energy is added to the resonant circuit in each cycle, and power is very efficiently converted from heat directly into electricity.

12 Claims, 4 Drawing Sheets

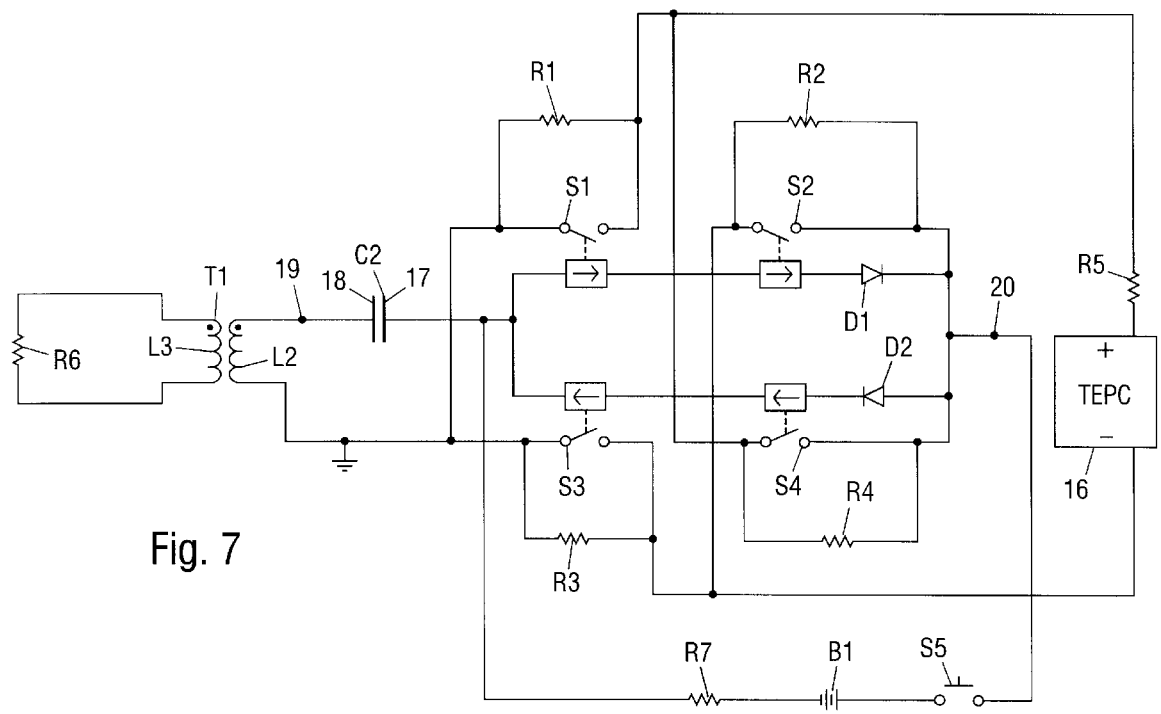
Fig. 7
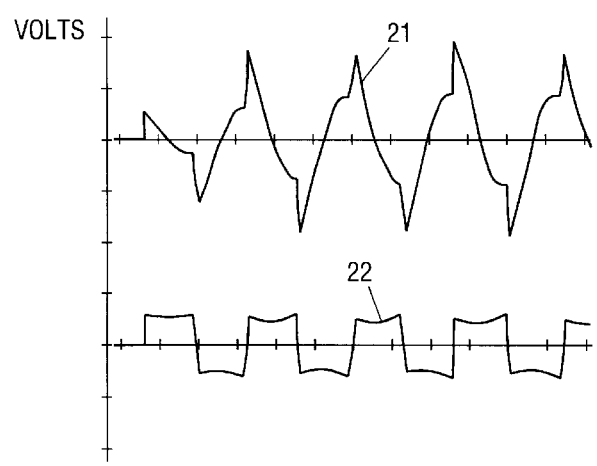
Fig. 8
Fig. 9

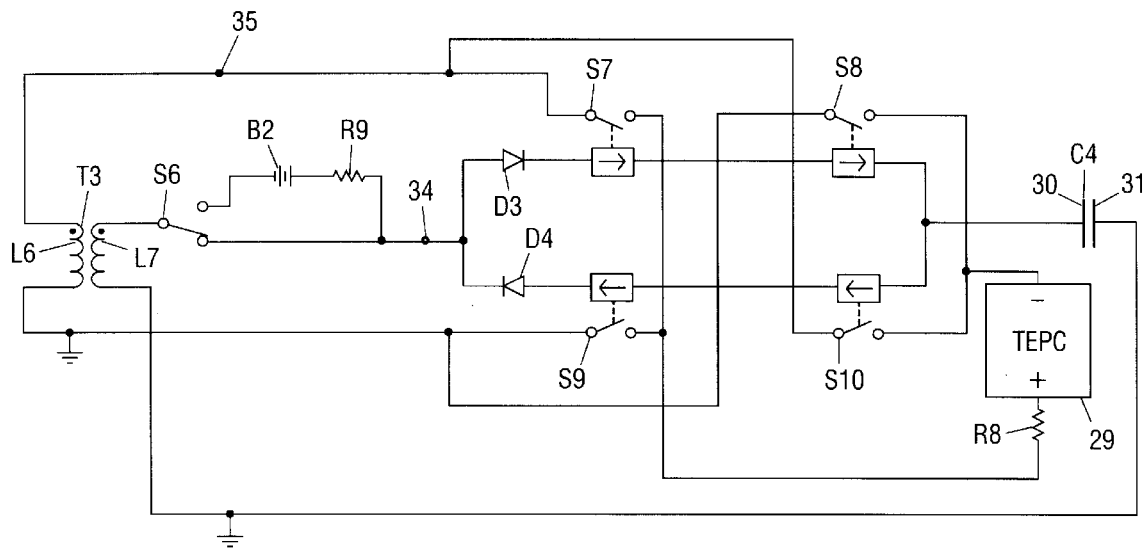
Fig. 16
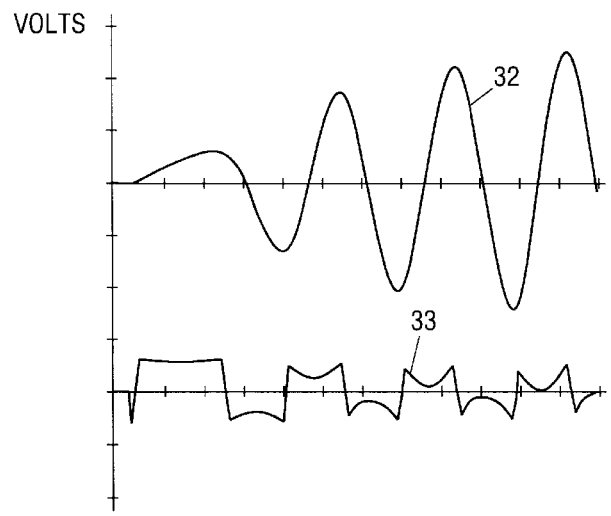
Fig. 17
Fig. 18

RESONANT THERMOELECTRIC GENERATOR

BACKGROUND OF THE INVENTION

1. Field of the Invention

This invention relates generally to electric power generators, specifically to a resonant thermoelectric generator.

2. Prior Art

A thermoelectric power converter is a device that converts heat directly into electricity. One such type of device is the thermionic power converter. It includes an emitter and a collector spaced by a vacuum gap. When the emitter is heated to between about 700°–1000° C., electrons are emitted toward the collector and a current is generated. For terrestrial applications, the heat source is typically a gas or oil flame, and for space applications, such as on satellites, the heat source is nuclear. An ideal thermionic power converter provides a current density according to the Richardson-Dushman equation as follows:

$$j = AT(sq.) \exp(-e \times Ew/K \times T)$$

where j=current density

A=constant

T=emitter temperature in degrees K e=charge on electron

Ew=work function

K=Boltzmann constant

Actual thermionic power converters have been operated at 10–20% efficiencies, and with more than 10,000 hour lifetimes. However, in practice, the gap between the electrodes is quickly saturated with a negative charge, also known as a space charge or retarding voltage, that inhibits further electron emission from the emitter and causes the generator to become negatively biased. As a result, the output from an actual thermionic power converter is much less than the theoretical potential of an ideal generator. Higher power levels may only be achieved by avoiding the retarding voltage. One method for reducing or eliminating the retarding voltage involves providing positive ions in the space between the electrodes to neutralize the negative space charge. Some success has been achieved in reducing the retarding voltage, but the fundamental problem of reduced efficiency with reverse bias due to the space charge has not been solved. Further reductions in efficiency are caused by heat losses due to radiation and conduction along emitter leads, and joule heat loss due to plasma and lead resistance.

Another type of thermoelectric power converter is the thermocouple. It is a device that consists of two dissimilar metals joined together or a semiconductor P-N junction. When one side is heated, electrons are emitted from the emitter (cathode) toward the collector (anode), so that a current is generated. Like the thermionic power converter, thermocouples are also limited in power generating efficiency due to the buildup of a negative charge or retarding voltage between the terminals.

OBJECTS OF THE INVENTION

Accordingly the primary object of the present invention is to provide a resonant thermoelectric generator that avoids the retarding voltage problem to achieve much higher generating efficiencies. p Another object of the present invention is to provide a resonant thermoelectric generator with reduced conductive heat loss to further improve power generating efficiency.

Further objects of the present invention will become apparent from a consideration of the drawings and ensuing description.

SUMMARY OF THE INVENTION

In a first embodiment, a resonant thermoelectric generator includes a thermoelectric power converter connected in series to a resonant circuit that includes a capacitor and an inductor. A current supplied by the thermoelectric power converter is cycled in alternate directions by the resonant circuit. The connections between the thermoelectric power converter and the resonant circuit are reversed back and forth, so that the polarity of the thermoelectric power converter is switched to correspond with the direction of the current. As a result, the negative retarding voltage that typically builds up in thermoelectric power converters is eliminated, and energy is added by the thermoelectric power converter to the resonant circuit in each cycle to generate power at very high efficiency.

In a second embodiment, a resonant thermoelectric generator includes two circuits coupled by a transformer. The first circuit includes a thermoelectric power converter connected in series to the primary winding of the transformer. The second circuit is a resonant circuit that includes a capacitor connected in series to the secondary winding of the transformer. When a current is supplied by the thermoelectric power converter to the first circuit, another current is induced in the second or resonant circuit by the transformer in the same direction. Both currents are simultaneously cycled in alternate directions by the resonant circuit. The connections between the thermoelectric power converter and the primary winding are reversed back and forth, so that the polarity of the thermoelectric power converter is switched to correspond with the direction of the currents. As a result, the negative retarding voltage in the thermoelectric power converter is eliminated, and energy is generated at very high efficiency.

BRIEF DESCRIPTION OF THE DRAWINGS

FIG. 7 is a detailed circuit diagram of the first embodiment of the resonant thermoelectric generator.

FIG. 8 is a waveform generated by the resonant thermoelectric generator of FIG. 7.

FIG. 9 is a waveform generated by the resonant thermoelectric generator of FIG. 7.

FIG. 16 is a detailed circuit diagram of the second embodiment of the resonant thermoelectric generator.

FIG. 17 is a waveform generated by the resonant thermoelectric generator of FIG. 16.

FIG. 18 is a waveform generated by the resonant thermoelectric generator of FIG. 16.

Figure 1:
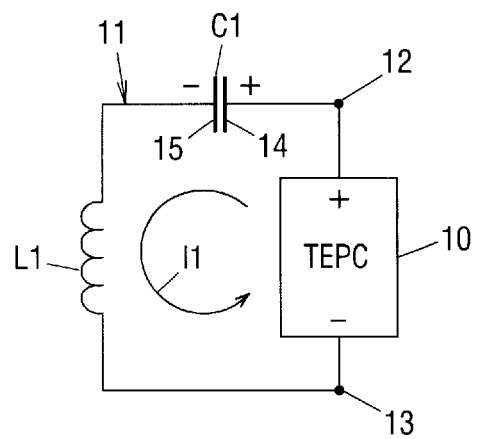
FIG. 1 is a simplified circuit diagram of a resonant thermoelectric generator, in accordance with a first embodiment of the invention, that illustrates its theory of operation.

DRAWING REFERENCE NUMERALS principle of electron emission from hot metal in vacuum, and a thermocouple, which employs the principle of electron diffusion between dissimilar metals or semiconductor P-N junction. The values of capacitor C1 and inductor L1 are chosen so that the current of resonant circuit 11 matches the supply current of thermoelectric power converter 10.

Figure 2:
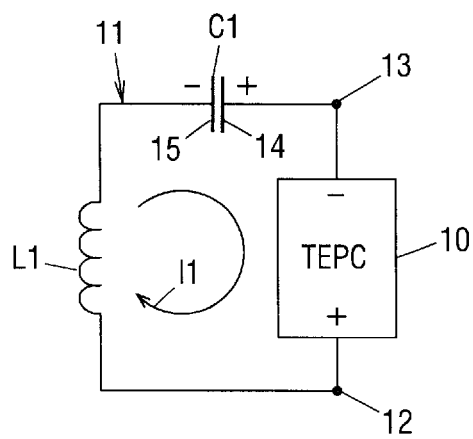
FIG. 2 is the simplified circuit diagram of the first embodiment of the resonant thermoelectric generator in another stage of its operation.

In FIG. 1, side 14 of capacitor C1 is charged by power converter 10 to a positive potential with a counterclockwise current 11. When the negative terminal of power converter 10 becomes negatively biased due to the buildup of a negative retarding voltage, power converter 10 is no longer able to charge capacitor C1, so that current I1 is reduced to zero. When current 11 equals zero, connections 12 and 13 between power converter 10 and resonant circuit 11 are reversed, as shown in FIG. 2. The mechanism for reversing the connections will be described in conjunction with FIG. 7. Instead of crossing the lead lines, power converter 10 is shown inverted in FIG. 2 for clarity. The polarity of power converter 10 is thus reversed with respect to FIG. 1. Side 14 of capacitor C1, which is charged to a positive potential, is now connected to the negative terminal of power converter 10 to forward bias it and eliminate the negative retarding voltage. The direction of current I1 is reversed, and side 15 of capacitor C1 is charged by a combination of the returning energy and additional energy from power converter 10.

Drawing Reference Numerals

| | |
|---|---|
| 10. Thermoelectric Power Converter | 11. Resonant Circuit |
| 12. Connection | 13. Connection |
| 14. Side Of Capacitor | 15. Side Of Capacitor |
| 16. Thermoelectric Power Converter | 17. Side Of Capacitor |
| 18. Side Of Capacitor | 19. Test Point |
| 20. Test Point | 21. Waveform |
| 22. Waveform | 23. Thermoelectric Power Converter |
| 24. Circuits | 25. Connection |
| 26. Connection | 27. Side Of Capacitor |
| 28. Side Of Capacitor | 29. Thermoelectric Power Converter |
| 30. Side Of Capacitor | 31. Side Of Capacitor |
| 32. Waveform | 33. Waveform |
| 34. Test Point | 35. Test Point |
| B1. Startup Battery | B2. Startup Battery |
| C1. Capacitor | C2. Capacitor |
| C3. Capacitor | C4. Capacitor |
| D1. Steering Diode | D2. Steering Diode |
| D3. Steering Diode | D4. Steering Diode |
| I1. Current | I2. Current |
| I3. Current | L1. Inductor |
| L2. Winding | L3. Winding |
| L4. Winding | L5. Winding |
| L6. Winding | L7. Winding |
| R1. Resistor | R2. Resistor |
| R3. Resistor | R4. Resistor |
| R5. Internal Resistance Of Converter | R6. Load |
| R7. Internal Resistance Of Startup Battery | R8. Internal Resistance Of Converter |
| R9. Internal Resistance Of Startup Battery | S1. Current Controlled Switch |
| S2. Current Controlled Switch | S3. Current Controlled Switch |
| S4. Current Controlled Switch | S5. Start Switch |
| S6. Start Switch | T1. Transformer |
| T2. Transformer | T3. Transformer |

DESCRIPTION—FIGS. 1–6—THEORY OF FIRST EMBODIMENT

Figure 3:
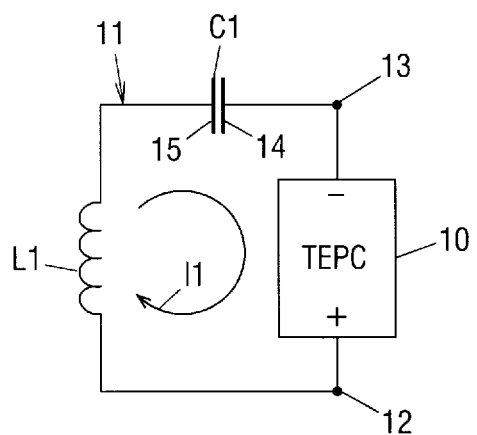
FIG. 3 is the simplified circuit diagram of the first embodiment of the resonant thermoelectric generator in yet another stage of its operation.
Figure 4:
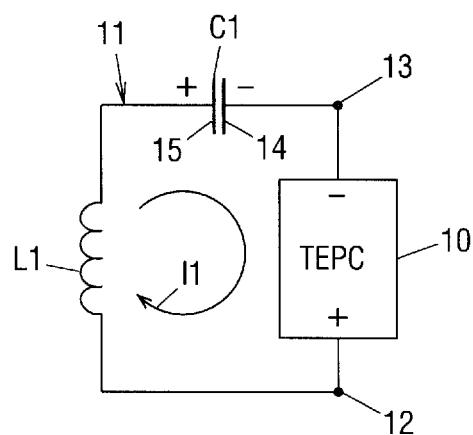
FIG. 4 is the simplified circuit diagram of the first embodiment of the resonant thermoelectric generator in yet another stage of its operation.
Figure 5:
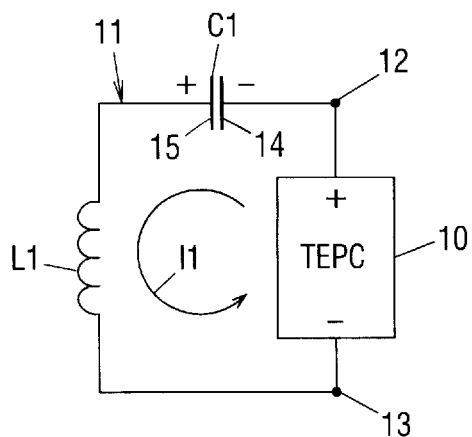
FIG. 5 is the simplified circuit diagram of the first embodiment of the resonant thermoelectric generator in still another stage of its operation.

A simplified circuit diagram of a first embodiment of a resonant thermoelectric generator is shown in FIG. 1 to illustrate its theory of operation. It includes a thermoelectric power converter 10 connected in series to a cyclic or resonant circuit 11 with connections 12 and 13. Resonant circuit 11 includes a capacitor C1 and an inductor L1. Power converter 10 may be any type of device that converts heat energy directly into electrical energy, including but not limited to a thermionic power converter, which employs the When side 15 of capacitor C1 reaches the same potential as side 14, as shown in FIG. 3, all the potential energy in capacitor C1 is converted into kinetic energy in the form of current I1 within inductor L1. According to Lenz's theory, the inertia of current I1 within inductor L1 will keep it flowing in the same direction to continue to charge capacitor C1. Power converter 10 continues to charge side 15 of capacitor C1 to a positive potential, as shown in FIG. 4. When the negative terminal of power converter 10 again becomes negatively biased due to the buildup of a negative retarding voltage, power converter 10 is no longer able to charge capacitor C1, so that current I1 is reduced to zero. When current I1 equals zero, connections 12 and 13 are reversed again to reverse the polarity of power converter 10, as shown in FIG. 5. Side 15 of capacitor C1, which is charged to a positive potential, is now connected to the negative terminal of power converter 10 to forward bias it and eliminate the negative retarding voltage. The direction of current I1 is reverted back to counterclockwise, and side 14 of capacitor C1 is charged.

Figure 6:
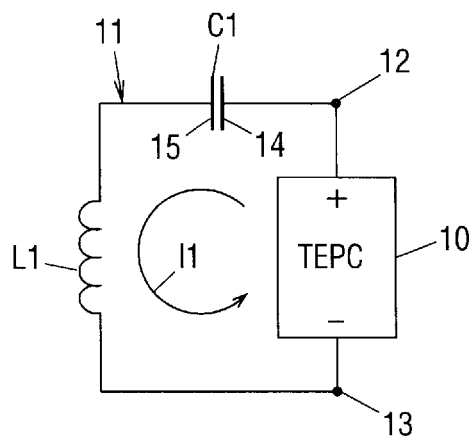
FIG. 6 is the simplified circuit diagram of the first embodiment of the resonant thermoelectric generator in still another stage of its operation.

When side 14 of capacitor C1 has reached the same potential as side 15, as shown in FIG. 6, the inertia of current I1 will keep it flowing in the same direction. When power converter 10 has charged side 14 of capacitor C1 to a positive potential, as shown in FIG. 1, and a retarding voltage has again built up in power converter 10, its polarity is again reversed, as shown in FIG. 2. The polarity of power converter 10 is repeatedly reversed to correspond with the direction of current I1, so as to eliminated the retarding voltage, and add energy to resonant circuit 11. Thus capacitor C1 is charged up to higher and higher voltages in successive cycles. Accordingly, when thermoelectric power converter 10 is used in combination with resonant circuit 11, and switched back-and-forth to correspond with the direction of current I1 in resonant circuit 11, it will achieve efficiencies equal to or greater than that predicted by the Richardson-Dushman equation.

DESCRIPTION—FIGS. 7–9—DETAILED CIRCUIT OF FIRST EMBODIMENT

The first embodiment of the resonant thermoelectric generator is implemented in the detailed circuit shown in FIG. 7. Thermoelectric power converter 16 is connected in series to a capacitor C2 and a primary winding L2 of a transformer T1. The polarity of power converter 16 with respect to capacitor C2 and winding L2 is determined by normally-open current controlled switches SI-S4.

On startup, power converter 16 is heated so that it produces electricity. A start switch S5 is momentary pressed to supply current from a startup battery B1 through steering diode D2 to close switches S3 and S4, which are kept closed by a current from power converter 16. The positive and negative terminals of power converter 16 are thus connected to sides 17 and 18, respectively, of capacitor C2. Side 17 of capacitor C2 is charged to a positive potential by power converter 16 through winding L2 of transformer T1. Primary winding L2 is equivalent to inductor L1 of FIG. 1. When the charging current is reduced to zero by the buildup of a retarding voltage in power converter 16, switches S3 and S4 are opened, and the first cycle is completed. Resistors R3 and R4, which have values that are selected for negligible power consumption, maintain continuity in the circuit when current controlled switches S3 and S4 are opened.

When side 17 of capacitor C2 is discharged, switches S1 and S2 are closed by the current flowing through steering diode D1. Side 17 of capacitor C2 is thus connected to the negative terminal of power converter 16, that is, the polarity of power converter 16 is reversed with respect to capacitor C2 and winding L2. The retarding voltage in power converter 16 is eliminated by the positive charge on side 17 of capacitor C2, and converter 16 is forward biased. Side 18 of capacitor C2 is charged to a positive potential by the returning energy and additional energy from power converter 16. When a retarding voltage is again built up in power converter 16, so that the charging current is reduced to zero, switches S1 and S2 are opened, and the second cycle is completed. Resistors R1 and R2, which also have values that are selected for negligible power consumption, maintain continuity in the circuit when switches S1 and S2 are opened.

When side 18 of capacitor C2 is discharged, switches S3 and S4 are closed by the current flowing in the opposite direction, so that the polarity of power converter 16 is reversed with respect to capacitor C2 and winding L2, and side 17 of capacitor C2 is again charged to a positive potential by the returning energy and additional energy from power converter 16. The two cycles are continuously repeated, wherein the polarity of power converter 16 is repeatedly reversed with respect to capacitor C2 and winding L2. Capacitor C2 is thus charged to higher and higher voltages until equilibrium is reached. Power is delivered by a secondary winding L3 of transformer T1 to a load R6. Although the switching of switches S1-S4 occur at peak voltages, they consume little or no energy because current is equal to zero at those instances.

The circuit of FIG. 7 was simulated in "Electronics Bench", a circuit simulation computer program, and generated waveforms 21 and 22 in FIGS. 8 and 9, respectively. In the simulation, power converter 16 was represented by a 12 V battery with an internal resistance of 5 Ω, which was represented by a resistor R5. Startup battery B1 was a 3 V battery with an internal resistance of 100 Ω, which was represented by a resistor R7. Capacitor C2 was a 5 µF capacitor, and resistors R1-R4 were 5 kΩ resistors. Transformer T1 was a 1:1 transformer, and load R6 had a resistance of 100 Ω. Waveforms 21 and 22 were taken at test points 19 and 20, respectively. Their vertical axis has 20 v/div., and their horizontal axes have 0.50 ms/div. Test point 19 shows the voltage on side 18 of capacitor C2, which quickly reached equilibrium due to the presence of load R6.

DESCRIPTION—FIGS. 10–15—THEORY OF SECOND EMBODIMENT

A simplified circuit diagram of a second embodiment of a resonant thermoelectric generator is shown in FIGS. 10 to 15 illustrate its theory of operation. It includes two circuits 24A and 24B coupled by a transformer T2. Circuit 24A includes a thermoelectric power converter 23 connected in series with an inductor or primary winding L4 of transformer T2. Circuit 24B is a resonant circuit that includes a capacitor C3 connected in series with another inductor or secondary winding L5 of transformer T2. Power converter 23 may be any type of device that converts heat energy directly into electrical energy, including but not limited to a thermionic power converter, and a thermocouple. The values of capacitor C3 and inductor L5 are chosen so that the current of circuit 24B matches the supply current of power converter 23.

Figure 10:
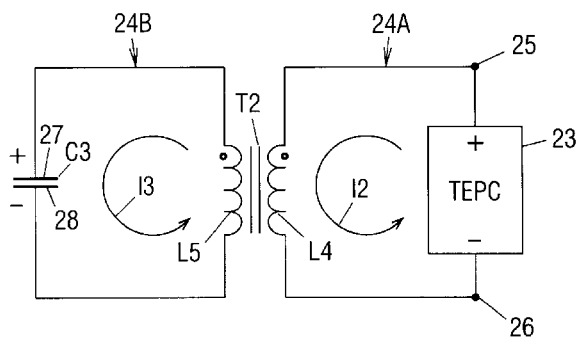
FIG. 10 is a simplified circuit diagram of a resonant thermoelectric generator, in accordance with a second embodiment of the invention, that illustrates its theory of operation.
Figure 11:
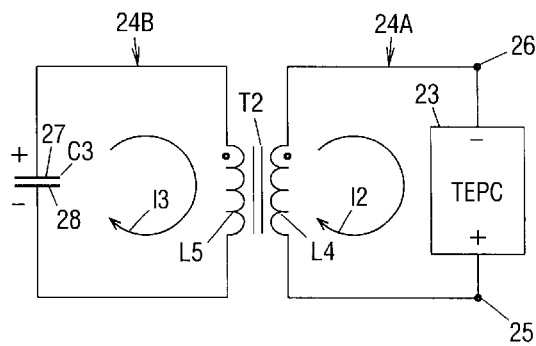
FIG. 11 is the simplified circuit diagram of the second embodiment of the resonant thermoelectric generator in another stage of its operation.

In FIG. 10, a counterclockwise current I2 is generated in circuit 24A by power converter 23. Another counterclockwise current I3 is induced by transformer T2 in circuit 24B, so that side 27 of capacitor C3 is charged to a positive potential. When power converter 23 becomes negatively biased due to the buildup of a negative retarding voltage, currents I2 and I3 are reduced to zero. At that moment, connections 25 and 26 between power converter 23 and primary winding L4 of transformer T2 are reversed, as shown in FIG. 11. The mechanism for reversing the connections will be described in conjunction with FIG. 16. Instead of crossing the lead lines, power converter 23 is shown inverted in FIG. 11 for clarity. Its polarity is thus reversed with respect to FIG. 10. Side 27 of capacitor C3, which is charge to a positive potential, is now coupled to the negative terminal of power converter 23 through transformer T2 to forward bias it and eliminate the negative retarding voltage. The direction of currents 12 and 13 are reversed, and side 28 of capacitor C3 is charged by the returning energy and additional energy from power converter 23.

Figure 12:
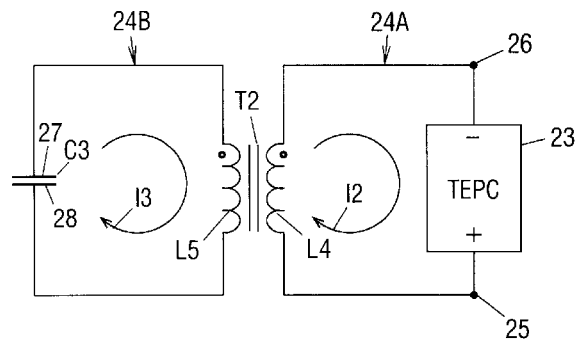
FIG. 12 is the simplified circuit diagram of the second embodiment of the resonant thermoelectric generator in yet another stage of its operation.
Figure 13:
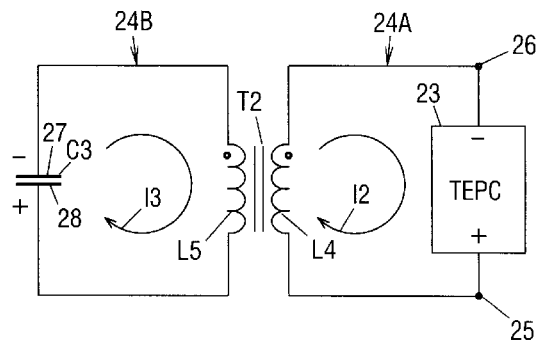
FIG. 13 is the simplified circuit diagram of the second embodiment of the resonant thermoelectric generator in yet another stage of its operation.
Figure 14:
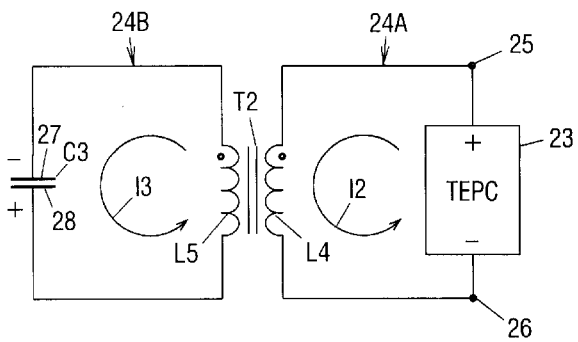
FIG. 14 is the simplified circuit diagram of the second embodiment of the resonant thermoelectric generator in still another stage of its operation.

When side 28 of capacitor C3 has reached the same potential as side 27, as shown in FIG. 12, all the potential energy in capacitor C3 is converted into kinetic energy in the form of currents 12 and 13. The inertia of currents 12 and 13 keeps them flowing in the same direction to continue to charge side 28 of capacitor C3 to a positive potential, as shown in FIG. 13. When the negative terminal of power converter 23 has again become negatively biased due to the buildup of a retarding voltage, currents 12 and 13 are reduced to zero. At that moment, connections 25 and 26 are reversed again to reverse the polarity of power converter 23, as shown in FIG. 14. Side 28 of capacitor C3, which is charged to a positive potential, is now coupled to the negative terminal of power converter 23 through transformer T2 to forward bias it and eliminate the negative retarding voltage. The direction of currents 12 and 13 are reverted back to counterclockwise, and side 27 of capacitor C3 is charged by the returning energy and additional energy from power converter 23.

Figure 15:
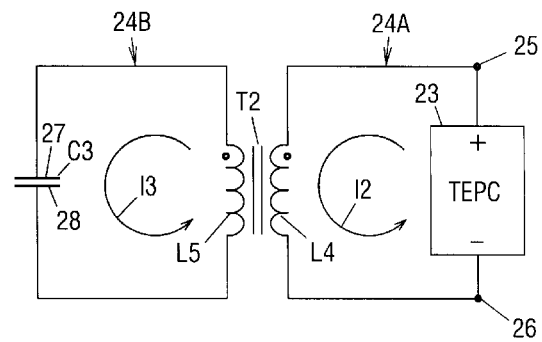
FIG. 15 is the simplified circuit diagram of the second embodiment of the resonant thermoelectric generator in still another stage of its operation.

When side 27 of capacitor C3 has reached the same potential as side 28, as shown in FIG. 15, the inertia of currents 12 and 13 keeps them flowing in the same direction to charge side 27 of capacitor C3 to a positive potential, as shown in FIG. 10. When a retarding voltage has again built up in power converter 23, its polarity is again reversed, as shown in FIG. 11. The polarity of power converter 23 is thus repeatedly reversed to always correspond with the direction of currents 12 and 13, so as to eliminated the retarding voltage, and add energy to circuits 24A and 24B. Thus capacitor C3 is charged up to higher and higher voltages in successive cycles.

Coupling power converter 23 to resonant circuit 24B through transformer T2 thermally isolates resonant circuit 24B from the heat generated by power converter 23, so that less heat resistant and therefore less expensive components may be used within resonant circuit 24B, including thinner wires for secondary winding L5. Conductive heat loss from power converter 23 to other components is also reduced due to the thermal isolation provided by transformer T2.

DESCRIPTION—FIGS. 16–18—DETAILED CIRCUIT OF SECOND EMBODIMENT

The second embodiment of the resonant thermoelectric generator is implemented in the detailed circuit shown in FIG. 16. A thermoelectric power converter 29 is connected in series to a primary winding L6 of a transformer T3, and a capacitor C4 is connected in series to a secondary winding L7 of transformer T3. The polarity of power converter 29 with respect to winding L6 is determined by normally-open current controlled switches S7–S10.

On startup, power converter 29 is heated so that it produces electricity. Start switch S6 is operated momentarily to supply current from a startup battery B2 to close switches S7 and S8 through steering diode D3. Sides 30 and 31 of capacitor C4 are thus magnetically coupled to the positive and negative terminals, respectively, of power converter 29. Switches S7 and S8 are kept closed by a current from power converter 29, and side 30 of capacitor C4 is charged to a positive potential by power converter 29 through the magnetic coupling of transformer T3. When a retarding voltage is built up in power converter 29 so that the charging current is reduced to zero, switches S7 and S8 are opened, and the first cycle is completed.

When side 30 of capacitor C4 is discharged, switches S9 and S10 are closed by the current flowing through steering diode D4. The polarity of power converter 29 is thus reversed with respect to winding L6, so that its negative terminal is magnetically coupled to side 30 of capacitor C4. The retarding voltage in power converter 29 is eliminated by the positive charge on side 30 of capacitor C4, and converter 29 is forward biased. Side 31 of capacitor C4 is charged to a positive potential through transformer T3 by the returning energy and additional energy from power converter 29. When a retarding voltage is again built up in power converter 29 so that the charging current is reduced to zero, switches S9 and S10 are opened, and the second cycle is completed.

When side 31 of capacitor C4 is discharged, switches S7 and S8 are closed by the current flowing through steering diode D3. The polarity of power converter 29 is again reversed with respect to winding L6, so that its negative terminal is magnetically coupled to side 31 of capacitor C4. The retarding voltage in power converter 29 is eliminated by the positive charge on side 31 of capacitor C4, and converter 29 is forward biased. Side 30 of capacitor C4 is charged to a positive potential through transformer T3 by the returning energy and additional energy from power converter 29. The two cycles are continuously repeated, wherein the polarity of power converter 29 is repeatedly reversed with respect to winding L6. Thus capacitor C4 is charged to higher and higher voltages until equilibrium is reached. A load (not shown) may be magnetically linked to transformer T3 by an additional winding (not shown).

The circuit of FIG. 16 was also simulated in the circuit simulation computer program "Electronics Bench", and generated waveforms 32 and 33 in FIGS. 17 and 18, respectively. In the simulation, power converter 29 was represented by a 12 V battery with an internal resistance of 5 Ω, which was represented by a resistor R8. Startup battery B2 was a 12 V battery with an internal resistance of 100 Ω, which was represented by a resistor R9. Capacitor C4 was a 2.5 µF capacitor, and transformer T3 was a 1:1 transformer. Waveforms 32 and 33 were taken at test points 34 and 35, respectively, and share a vertical axis with 20 v/div., and have horizontal axes with 0.10 ms/div. Waveform 32 shows the voltage on side 30 of capacitor C4, which reached higher levels than waveform 21 (FIG. 8) because of the absence of a load.

SUMMARY, SUBSTITUTES, AND SCOPE

Accordingly, I have provided a resonant thermoelectric generator that very efficiently converts heat directly into electricity. It uses the cyclic energy of a resonant circuit to keep a thermoelectric power converter in forward bias and eliminate the retarding voltage. When the thermoelectric power converter is magnetically coupled to the resonant circuit through a transformer, conductive heat loss from the thermoelectric power converter is also minimized.

Although the above descriptions are specific, they should not be considered as limitations on the scope of the invention, but only as examples of the embodiments. Many substitutes for the components and variations thereof are possible within the teachings of the invention. For example, any type of thermoelectric power converter can be used, including but not limited to thermionic power converters and thermocouples. Non-thermoelectric power sources, such as photocells, may also be used. The values of the components shown are only exemplary; they may be changed for making generators of different outputs and resonant frequencies. The current controlled switches may be mechanical relays or solid state switches. Other types of sensing and switching devices may be used for sensing the change in current direction and switching the polarity of the thermoelectric power converter to correspond with the direction of the current in the resonant circuit. Other types of resonant circuits may be used, or other types of circuits that alternate the direction of a current may be used. Therefore, the scope of the invention should be determined by the appended claims and their legal equivalents, not by the examples given.

I claim:

1. A resonant generator, comprising:

circuit means for cycling a current in alternate directions;

a polarized power converter connected in series with said circuit means for supplying said current, said power converter having a negative terminal and a positive terminal, a direction from said negative terminal to said positive terminal being a forward direction; and switching means connected to said polarized power converter for switching the polarity of said power converter with respect to said circuit means whenever the direction of said current is reversed, so that the polarity of said power converter is always oriented to match the direction of said current flowing in said circuit means.

2. The generator of claim 1 wherein said switching means comprises two pairs of switches, the switches in each pair operating synchronously, one pair of said switches connecting said terminals of said power converter to said circuit means so that the polarity of said power converter is oriented in one direction with respect to said circuit means, another pair of said switches connecting said terminals of said power converter to said circuit means so that the polarity of said power converter is oriented in an opposite direction with respect to said circuit means, said pairs of said switches operating alternately for repeatedly reversing the polarity of said power converter with respect to said circuit means.

3. The generator of claim 2 wherein said switches comprise current controlled switches.

4. The generator of claim 1, further including a startup battery connected in parallel to said circuit means.

5. A resonant thermoelectric generator, comprising:

a resonant circuit including a capacitor and an inductor connected in series for cycling a current in alternate directions;

a polarized thermoelectric power converter connected in series with said resonant circuit for supplying said current, said thermoelectric power converter having a negative terminal and a positive terminal, a direction from said negative terminal to said positive terminal being a forward direction; and switching means for switching the polarity of said thermoelectric power converter with respect to said resonant circuit whenever the direction of said current is reversed, so that the polarity of said thermoelectric power converter is always oriented to match the direction of said current flowing in said resonant circuit.

6. The resonant thermoelectric generator of claim 5 wherein said switching means comprises two pairs of switches, the switches in each pair operating synchronously, one pair of said switches connecting said terminals of said thermoelectric power converter to said resonant circuit so that the polarity of said thermoelectric power converter is oriented in one direction with respect to said resonant circuit, another pair of said switches connecting said terminals of said thermoelectric power converter to said resonant circuit so that the polarity of said thermoelectric power converter is oriented in an opposite direction with respect to said resonant circuit, said pairs of said switches operating alternately for repeatedly reversing the polarity of said thermoelectric power converter with respect to said resonant circuit.

7. The resonant thermoelectric generator of claim 6 wherein said switches comprise current controlled switches.

8. The resonant thermoelectric generator of claim 5, further including a startup battery connected in parallel to said resonant circuit.

9. A resonant thermoelectric generator, comprising:

a first circuit including a polarized thermoelectric power converter connected in series to a primary winding of a transformer, said thermoelectric power converter having a negative terminal and a positive terminal, a direction from said negative terminal to said positive terminal being a forward direction;

a second circuit including a capacitor connected in series to a secondary winding of said transformer, so that when a first current is generated by said thermoelectric power converter in said first circuit, a second current is induced by said transformer in said second circuit, said first current and said second current being cycled simultaneously in alternate directions by said second circuit; and switching means for switching the polarity of said thermoelectric power converter with respect to said first circuit whenever the direction of said first current is reversed, so that the polarity of said thermoelectric power converter is always oriented to match the direction of said first current flowing in said first circuit.

10. The resonant thermoelectric generator of claim 9 wherein said switching means comprises two pairs of switches, the switches in each pair operating synchronously, one pair of said switches connecting said terminals of said thermoelectric power converter to said first circuit so that the polarity of said thermoelectric power converter is oriented in one direction with respect to said first circuit, another pair of said switches connecting said terminals of said thermoelectric power converter to said first circuit so that the polarity of said thermoelectric power converter is oriented in an opposite direction with respect to said first circuit, said pairs of said switches operating alternately for repeatedly reversing the polarity of said thermoelectric power converter with respect to said first circuit.

11. The resonant thermoelectric generator of claim 10 wherein said switches comprise current controlled switches.

12. The resonant thermoelectric generator of claim 9, further including a startup battery connected in parallel to one of said circuits.

* * * * *